United States Patent [19]

Fox et al.

[11] Patent Number: 4,489,181

[45] Date of Patent: Dec. 18, 1984
:::

[54] THERMOPLASTIC POLYCARBONATE-POLYSULFONE CARBONATE MOLDING COMPOSITIONS

[76] Inventors: Daniel W. Fox, 193 Dawes Ave.; Robert R. Gallucci, 68 Winesap Rd., both of Pittsfield, Mass. 01201; Edward N. Peters, 51 West St., Lenox, Mass. 01240; Gary F. Smith, 140 Churchill St., Pittsfield, Mass. 01201

[21] Appl. No.: 549,572

[22] Filed: Nov. 7, 1983

[51] Int. Cl.$^3$ .......................... C08K 3/34; C08K 3/36; C08K 3/40; C08K 7/20

[52] U.S. Cl. ............................ 523/219; 524/425; 524/437; 524/449; 524/451; 524/452; 524/455; 524/456; 524/603; 524/609; 525/469; 525/470; 528/171; 528/173; 528/174

[58] Field of Search ............... 525/469, 470; 524/449, 524/603, 609, 425, 451, 455, 452, 437, 456; 528/171, 173, 174; 523/219

[56] References Cited

U.S. PATENT DOCUMENTS

| | | | |
|---|---|---|---|
| 3,169,121 | 2/1965 | Goldberg | 524/603 |
| 3,269,986 | 8/1966 | Goldberg | 528/171 |
| 3,271,367 | 9/1966 | Schnell et al. | 528/171 |
| 3,422,065 | 1/1969 | Wulff et al. | 525/469 |
| 3,737,409 | 6/1973 | Fox | 528/174 |
| 3,890,266 | 6/1975 | Serini et al. | 525/470 |
| 4,174,359 | 11/1979 | Sivaramakrishnan et al. | 528/204 |
| 4,285,855 | 8/1981 | Tokuda | 525/470 |
| 4,306,055 | 12/1981 | Baron et al. | 528/174 |
| 4,400,499 | 8/1983 | Colon | 528/174 |
| 4,404,351 | 9/1984 | Kafer et al. | 528/171 |
| 4,425,456 | 1/1984 | Baron et al. | 524/609 |

*Primary Examiner*—Herbert J. Lilling

[57] ABSTRACT

Compositions of an aromatic polycarbonate, a polysulfone carbonate and a filler are disclosed which have good electrical properties, high modulus and molten solder resistance.

9 Claims, No Drawings

THERMOPLASTIC POLYCARBONATE-POLYSULFONE CARBONATE MOLDING COMPOSITIONS

This invention relates to novel thermoplastic molding compositions based on an aromatic polycarbonatepolysulfone carbonate blends and a filler.

BACKGROUND OF THE INVENTION

Aromatic polycarbonate are well known engineering thermoplastics that are in wide commercial use. Aromatic polysulfone carbonates have been described in the patent literature and it is known to use them in combination with an aromatic polycarbonate. In the, Fox, U.S. Pat. No. 3,737,409 which is incorporated by reference, the compositions include a copolymer of the reaction product of (a) bis-(3,5-dimethyl-4-hydroxyphenyl)sulfone, (b) 2,2-bis-(4-hydroxyphenylpropane) and (c) a carbonate precursor. These compositions are intended for molding applications, extrusion applications and for making films and fibers.

Applicants herein have found that the addition of fillers to blends of these copolymers with aromatic polycarbonates increases the modulus without decreasing the electrical properties. These compositions also have higher heat distortion temperatures and do no warp when immersed in molten solder.

Accordingly, it is a primary object of this invention to provide filled polycarbonate-polysulfone carbonate compositions having increased modulus without decreasing electrical properties.

It is also an object of this invention to provide filled polycarbonate-polysulfone carbonate compositions having increased heat distortion temperatures.

DETAILED DESCRIPTION OF THE INVENTION

The compositions of the invention are filled thermoplastic molding compositions comprising:

(a) from 99 to 1 parts by weight of (i) an aromatic polycarbonate and from 1 to 99 parts by weight of (ii) an aromatic polysulfone carbonate resin derived from:
(1) a diaryl phenol of formula I:

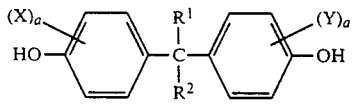

wherein $R^1$ and $R^2$ are hydrogen (lower) alkyl of from 1 to 6 carbons or phenyl; X and Y are halogen; and a is 0, 1, 2, 3 or 4;
(2) a diaryl phenol of formula II:

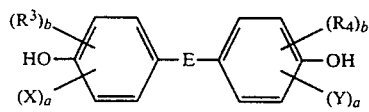

wherein $R^3$ and $R^4$ may be the same or different and are (lower) alkyl of from 1 to 6 carbon atoms; b is 0 or 1 to 3; X, Y and a are the same as set forth hereinabove; and E is $SO_2$ or S.

(b) an effective amount of a filler that increases the modulus of the composition.

The aromatic polycarbonates form a family of resins well known to those skilled in this art. In general, they are formed by reacting a dihydroxy diaryl compound, e.g., bisphenol A, with a carbonate precursor, e.g., phosgene. See, for example, U.S. Pat. No. 3,153,008, incorporated herein by reference to save unnecessarily detailed description.

The polysulfone carbonate may be derived form 10-90 mole % of a diphenol of formula I and from 90-10 mole % of a diphenol of formula II.

Examples of dihydric phenols of formulas I and II are given in U.S. Pat. No. 3,169,121 which is incorporated by reference. The preferred dihydric phenol of formula I is 2,2-bis(4-hydroxyphenyl)propane which is also known as bisphenol-A and the preferred dihydric phenol of formula II is bis-(3,5-dimethyl-4-hydroxyphenyl)-sulfone. The preferred polysulfone carbonates have a 50:50 mol ratio of 2,2-bis(4-hydroxyphenyl)propane to bis-(3,5-dimethyl-4-hydroxyphenyl sulfone.

The fillers include glass, wollastonite, mica, processed mineral filler, asbestos, silica, silicates, talc, clay and calcium carbonate. Preferably, the fillers comprise calcium carbonate, talc, mica, processed mineral fibers, alumina trihydrate, feldspar, silica, glass flakes, solid glass spheres, hollow glass spheres, aramid fibers, glass fibers, carbon fibers, wollastonite, asbestos or mixtures of any of the foregoing. These fillers are preferably utilized at from 5-40% by weight of the total composition and more preferably from 10-30% by weight of total composition.

The compositions may also include pigments, stabilizers, anti-oxidants, impact modifiers and the like.

The compositions may be prepared by dry blending the ingredients in powdered form after drying the ingredients at 125° C. for 3 to 6 hours followed by extrusion at 300°-325° C. and pelletizing. The pellets may be molded at 310°-330° C. in conventional injection molding machines or by compression moldings at 310°-330° C. and 20,000-30,000 psi.

DESCRIPTION OF THE PREFERRED EMBODIMENTS

The following examples illustrate the invention. They are set forth as a further description but are not to be construed as limiting the invention thereto.

EXAMPLE 1

Compositions are prepared from a 50:50 weight/weight blend of an aromatic polycarbonate of bisphenol A and phosgene and a polysulfone carbonate having an intrinsic viscosity of 0.6 dl/g (detn. in 60:40 phenol:tetrachloroethane at 30° C.) derived from phosgene and 2,2-bis-(4-hydroxyphenyl)propane and bis-(3,5-dimethyl-4-hydroxyphenyl)sulfone (1:1 mol ratio) and filamentous glass (¼" chopped strand). The filamentous glass is dried for 6 hours at 125° C. and the polysulfone carbonate and aromatic polycarbonate are dried 3 hours at 125° C. A composition is prepared using a ¾" single screw extruder (300°-315° C./40-50 rpm) that is 24 wt% glass and 76 wt% of the polysulfone carbonate/bisphenol A carbonate.

The composition is injection molded (310°-327° C.) after 6 hours of drying at 125° C. Test specimens are compression molded at 315° C. (30,000 psi). The properties of the composition are as follows:

| Flexural modulus | 1,000,000 psi |
|---|---|
| Flexural strength | 20,000 psi |

-continued

| HDT (264 psi) | 191° C. |
|---|---|
| Notched Izod (⅛") | 0.7 ft.lbs./in. |

EXAMPLE 2

Using conditions similar to those used in Example 1, and the same 50:50 bisphenol A carbonate/polysulfone carbonate blend used in Example 1. The following compositions are prepared.

| Filler | Wt % | HDT° C. (264 psi) | Flex. Mod. (psi) | Flex. Strength (psi) |
|---|---|---|---|---|
| None* | 0 | 180 | 356,000 | 17,500 |
| Glass | 10 | 190 | 596,000 | 20,600 |
| Glass | 20 | 191 | 872,000 | 22,000 |
| Glass | 24 | 191 | 1,000,000 | 20,000 |
| Glass | 30 | 191 | 1,160,000 | 17,200 |
| Wollastonite | 20 | 177 | 525,000 | 10,800 |
| Wollastonite | 30 | 178 | 635,000 | 7,000 |
| PMF** | 25 | 185 | 604,000 | 15,400 |
| mica | 20 | 187 | 767,000 | 18,300 |

*Control
**Processed Mineral fiber, Jim Walter

Resources, 45% $SiO_2$; 37% CaO, 8% $Al_2O_3$; 6% MgO; 4% misc. PMF is a short single strand, glass fiber with an average fiber diameter of 4 to 6 microns, an average aspect ratio of 40 to 60, and a specific gravity of 2.7.

EXAMPLE 3

Compositions are prepared using the 50:50 aromatic polycarbonate/polysulfone carbonate of Example 1 and the listed fillers:

| Filler (wt %) | None* | Glass (24 wt %) | PMF (25 wt %) |
|---|---|---|---|
| Delectric Constant | | | |
| 60 Hz | 3.1 | 3.3 | 3.4 |
| $10^3$ Hz | 3.1 | 3.3 | 3.4 |
| $10^6$ Hz | 3.1 | 3.4 | 3.5 |
| Dissipation Factor | | | |
| 60 Hz | .005 | .005 | .005 |
| $10^3$ Hz | .005 | .005 | .005 |
| $10^6$ Hz | .012 | .012 | .012 |
| Dielectric Strength v/mil | 460 | 560 | 540 |
| Volume Resistivity ohm-cm | $10^{16}$ | $10^{16}$ | $10^{16}$ |
| Warpage in molten solder | yes | no | no |

*Control
**Processed Mineral fiber as in Example 2

The foregoing results demonstrate that the present invention provides a high heat deflection temperature, high modulus material, having properties suitable for many applications, especially printed wiring boards. The heat deflection temperatures are approximately 15° C. higher than state-of-the-art, e.g., the MINDEL ® resins, which are glass reinforced polysulfones. This makes the instant compositions more amenable to wave soldering—a key property requirement for printed wiring board materials.

It will thus be seen that the objects set forth above among those made apparent from the preceding description are efficiently attained and since certain changes may be made in carrying out the above process and in the composition set forth without departing from the scope of the invention, it is intended that all matters contained in the above description shall be interpreted as illustrative.

We claim:

1. A thermoplastic filled molding composition which comprises:
   (a) a blend of from 99 to 1 parts by weight of (i) an aromatic homo-polycarbonate derived from bisphenol-A and from 1 to 99 parts by weight of (ii) an aromatic polysulfone carbonate resin derived from:
   (1) a diaryl phenol of formula I:

$$(X)_a \text{—} \underset{HO}{\bigcirc} \text{—} \underset{R^2}{\overset{R^1}{C}} \text{—} \underset{OH}{\bigcirc} \text{—} (Y)_a$$

wherein $R^1$ and $R^2$ are hydrogen, (lower) alkyl of from 1 to 6 carbons or phenyl; X and Y are halogen; and a is 0, 1, 2, 3 or 4;
   (2) a diaryl phenol of formula II:

$$(R^3)_b \text{—} \underset{HO, (X)_a}{\bigcirc} \text{—} E \text{—} \underset{OH, (Y)_a}{\bigcirc} \text{—} (R_4)_b$$

wherein $R^3$ and $R^4$ may be the same or different and are (lower) alkyl of from 1 to 6 carbon atoms; b is 0 or 1 to 3, X, Y and a are the same as set forth in (i) and E is $SO_2$ or S;
   (b) an effective amount of filler that increases the modulus of the composition.

2. A thermoplastic molding composition as defined in claim 1 wherein the polycarbonate (a)(i) is the reaction product of 2,2-bis(4-hydroxyphenol)propane and phosgene.

3. A thermoplastic molding composition as defined in claim 1 wherein from 10–90 mole % of the aromatic polysulfone carbonate (a)(ii) is the reaction product of diaryl phenol of formula I and 90–10 mole % is the reaction product of diaryl phenol of formula II.

4. A thermoplastic molding composition as defined in claim 3 wherein the diaryl phenol of formula I is 2,2-bis(4-hydroxyphenyl)propane.

5. A thermoplastic molding composition as defined in claim 3 wherein the diaryl phenol of formula II is bis(3,5-dimethyl-4-hydroxyphenyl)sulfone.

6. A thermoplastic molding composition as defined in claim 1 wherein the filler is selected from calcium carbonate, talc, mica, alumina trihydrate, feldspar, silica, glass flakes, solid glass spheres, hollow glass spheres, aramid fibers, glass fibers, carbon fibers, wollastonite, asbestos and mixtures thereof.

7. A thermoplastic molding composition as defined in claim 6 wherein the filler is mica.

8. A thermoplastic molding composition as defined in claim 6 wherein the filler is glass fibers.

9. A thermoplastic molding composition as defined in claim 6 wherein the filler is carbon fibers.

* * * * *